(12) United States Patent
Pajonk et al.

(10) Patent No.: US 6,574,857 B1
(45) Date of Patent: Jun. 10, 2003

(54) ASSEMBLY DEVICE

(75) Inventors: Joachim Pajonk, Miesbach (DE); Jörg Pogert, Riemerling (DE); Jochen Kranich, Pullach (DE); Jakob Fischer, Unterhaching (DE)

(73) Assignee: Simotec GmbH, Taufkirchen (DE)

( * ) Notice: Subject to any disclaimer, the term of this patent is extended or adjusted under 35 U.S.C. 154(b) by 0 days.

(21) Appl. No.: 09/807,185

(22) PCT Filed: Aug. 11, 2000

(86) PCT No.: PCT/EP00/07837

§ 371 (c)(1),
(2), (4) Date: May 23, 2001

(87) PCT Pub. No.: WO01/13409

PCT Pub. Date: Feb. 22, 2001

(30) Foreign Application Priority Data

Aug. 11, 1999 (EP) .............................................. 99115834

(51) Int. Cl.⁷ .............................. B23P 19/00; B65H 1/00
(52) U.S. Cl. .............................. 29/740; 29/832; 29/837; 414/222.01; 414/222.06; 414/222.07; 414/222.12
(58) Field of Search .......................... 29/832, 833, 837, 29/739, 740, 741, 743, 744; 414/222.01, 222.07, 222.12, 222.02, 222.06

(56) References Cited

U.S. PATENT DOCUMENTS

| | | | | |
|---|---|---|---|---|
| 4,078,302 A | * | 3/1978 | Fok et al. | 29/741 |
| 4,393,579 A | | 7/1983 | Van Hooreweder | |
| 5,456,001 A | * | 10/1995 | Mori et al. | 29/739 |
| 5,924,192 A | * | 7/1999 | Wuyts | 29/833 |

FOREIGN PATENT DOCUMENTS

EP      0- 582 086 A      2/1994

* cited by examiner

Primary Examiner—David J. Walczak
(74) Attorney, Agent, or Firm—Weingarten, Schurgin, Gagnebin & Lebovici LLP

(57) ABSTRACT

An assembly device, in particular a fully automatic assembly device for producing microsystem technical products and for assembling components in the semiconductor industries, comprising an assembly table, at least one material transport system that transports the products to be placed with components, at least one transport system arranged on the assembly table, and at least one component transport unit that is arranged and displaceable perpendicularly to the transport system and that comprises at least one assembly head, said component transport unit(s) is/are arranged on one or more portals displaceable by means of the transport system in parallel to the direction of transport of the products to be placed with components, which products are in turn displaced by the material transport system.

9 Claims, 5 Drawing Sheets

ASSEMBLY DEVICE

Figure 1:
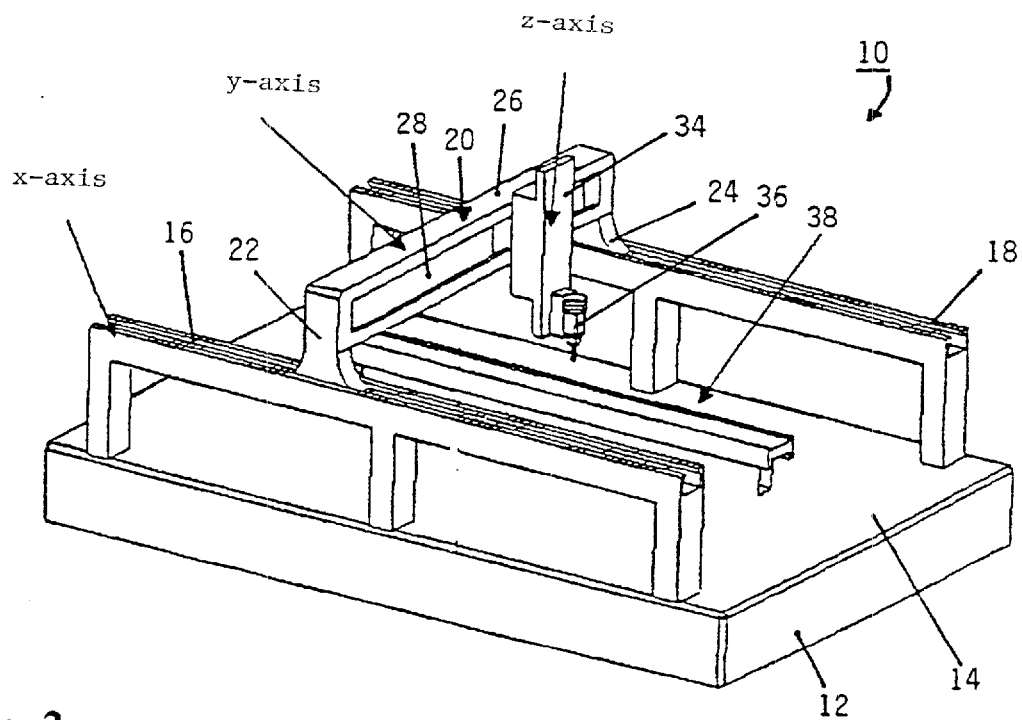

The present invention relates to an assembly device, in particular to a fully automatic assembly device for producing microsystem technical products and for assembling components in the semiconductor industries, comprising an assembly table, at least one material transport system that transports the products to be placed with components, and at least one transport system mounted on the assembly table, and at least one component transport unit that is arranged and displaceable perpendicularly to the transport system and that comprises at least one assembly head.

Such assembly devices are known from prior art. Known generic assembly devices can be classified in three main categories: Assemblers/inserters for producing electronic components, assembly automates for the semiconductor industry and laboratory devices for the assembly of samples of microsystem technical demonstration models. Such assembly devices, however, exhibit manifold disadvantages in particular for the production of Microsystems.

Thus, so-called assemblers/inserters are optimized for speed, i.e. for a maximum throughput of placement numbers of up to 100,000 insertion units/h. However, they exhibit the disadvantage of entailing a reduced assembly accuracy with an increase of the speed. This means that such assembly devices are only used for a very restricted spectrum of components, substrates and assembly processes. The use of assemblers/inserters for the assembly of Microsystems is not possible in particular for reasons of precision and due to a lack of flexibility.

Compared thereto, assembly automates for the semiconductor industry, the so-called die bonders, are optimized for process security, i.e. in particular for a relatively high assembly accuracy. A plurality of die bonder configurations is thereby known. These, however, suffer from the disadvantage that the applied and hitherto known frame techniques in combination with the assembly movements to be carried out either are an encumbrance for the space available, i.e. the restriction to the working space available on the assembly table, or the adaptability and configurability, respectively and accessibility of the device is impeded and restricted, respectively. Moreover, a sufficient rigidity of the known die bonder structures for achieving high assembly accuracies with correspondingly high process speeds for obtaining high throughput numbers has not been solved to date in a satisfying manner.

Assembly devices known from the electronic and semiconductor industries therefore comply neither with the combined requirements for assembly precision at a simultaneously high throughput rate, nor are they configured so flexibly that a rapid adaptability to different process requirements and material presentations can take place.

It is therefore the object of the present invention, to provide for a generic assembly device, which guarantees a high assembly precision, a high throughput rate, as well as a simple adaptability.

This task is solved by an assembly device having the features pursuant to claim 1.

Advantageous configurations are described in the subclaims.

With an inventive assembly device, a component transport unit, or component transport units, is/are arranged on one or more portals displaceable by means of a transport system in parallel to the direction of transport of the products to be placed with components, which products are in turn displaced by the material transport system(s).

Due to the inventive arrangement of the portal and the material transport system, it is possible to mainly move only the assembly head for material transportation. The portal itself thereby only carries out a short balancing movement in certain assembly modes, so that relatively small masses have to be moved. Thereby, the assembly head can be moved at a higher speed, which in turn leads to higher throughput rates at an increased assembly precision. It is moreover possible to execute larger transport movements by a displacement of the portals, so that the entire available surface of the assembly table can be covered, hence enabling a high component or substrate variation. Furthermore, due to the portal/s displaceable in parallel and arranged perpendicular to the direction of the material transport system, it becomes possible that materials of a high width, respectively products of a high width to be placed with components, can be processed. Alternatively thereto, several material transport units can be arranged simultaneously in the assembly device, so that, due to this fact, the placement speed can also be distinctly increased. By means of the portal structure, it is moreover inventively achieved that the center of gravity of the transport system, and of all movable elements of the assembly device, respectively, lies relatively close to the surface of the assembly table. Thereby, a still more vibration-free structure of the assembly device is achieved, so that a very high assembly precision is guaranteed. Due to the portal structure, the space available on the assembly table remains maintained, a fact which is advantageous for accessibility, adaptability and configurability.

In an advantageous configuration of the inventive assembly device, the transport system is comprised of a rail system having a first rail and a second rail arranged parallel to one another. By means of this rail system, an exact displacement of the portal/s is guaranteed.

In another advantageous configuration of the inventive assembly device, the transport system is comprised of a third rail displaceable in a machine frame of the assembly device in parallel to the direction of transport of the products to be placed with components, which products are in turn displaced by the material transport system/s, whereby at least one portal carrier engages perpendicularly into said rail, so that the portal/s is/are displaceable.

Thereby, reaction forces from the movement of the component transport unit are diverted in an optimized manner. Occurring vibrations are minimized by means of the improved power flux.

In a further advantageous configuration of the invention, the portal or the portal carrier, comprises a bearing at its end lying opposite to the third rail, said bearing coming to rest on a counter-bearing configured in the machine frame and in parallel to the third rail. Thereby, the space available on the assembly level is increased again. In addition, the accessibility of the assembly device and the free configurability thereof is enhanced.

In a further advantageous embodiment of the inventive assembly device, the transport system presents at least one portal drive. Although the use of a single portal drive already leads to excellent results in the field of assembly accuracy and assembly speed, the use of two portal drives, each arranged on one side of the portal, can result in even higher assembly accuracies and assembly speeds. This resides in the reason that the gravity center of the portal, as a rule, is eccentrically relative to the drive system or the position of the gravity center of the portal, is time-variable due to continuously changing load conditions. This eccentricity or time-variability, can lead to unbalances having a correspondingly negative influence on the assembly or positioning precision of the portal. By the use of two controlled portal drives, it is guaranteed that the gravity center of the portal is always between the drives, and hence, an eccentric position cannot occur. By using two controlled portal drives, it can moreover be achieved that, depending on the actual position of the gravity center of the portal, the drive control can be conceived adaptively, so that a high dynamic rigidity of the portal structure can be obtained. This inventive configuration hence allows for carrying out positioning in an even more exact manner.

In a further advantageous configuration of the inventive assembly device, the transport system is arranged at the table level of the assembly table. Thereby, the entire structure of the assembly device is guaranteed to be extremely vibration-free.

In a further advantageous configuration of the invention, it is, however, possible that the transport system is disposed above the table level of the assembly table. Thereby, the free space available on the assembly table surface is increased, so that a larger number of various components or the like can be arranged.

In a further advantageous configuration of the inventive assembly device, the movements of several portals can be mutually synchronized. Thus, the production speed can be considerably increased. By a dynamically optimized synchronization of several portals in their respective movements, a distinct reduction of machine vibrations can be achieved (dynamic balancing), by means of which the assembly accuracy can be further increased.

In a further advantageous configuration of the invention, the assembly head is comprised of a vertically or horizontally arranged turret head. By the use of a turret head, the number of transport travels can be considerably reduced, whereby ancillary transport times can be decreased, and the production speed in turn can be increased.

In a further advantageous configuration of the invention, it is also possible to arrange several portals one above the other. Such an arrangement increases the number of assembly levels, which in turn leads to an increase of the production speed and to a still higher flexibility with respect to the application fields of the inventive assembly device.

Figure 2:
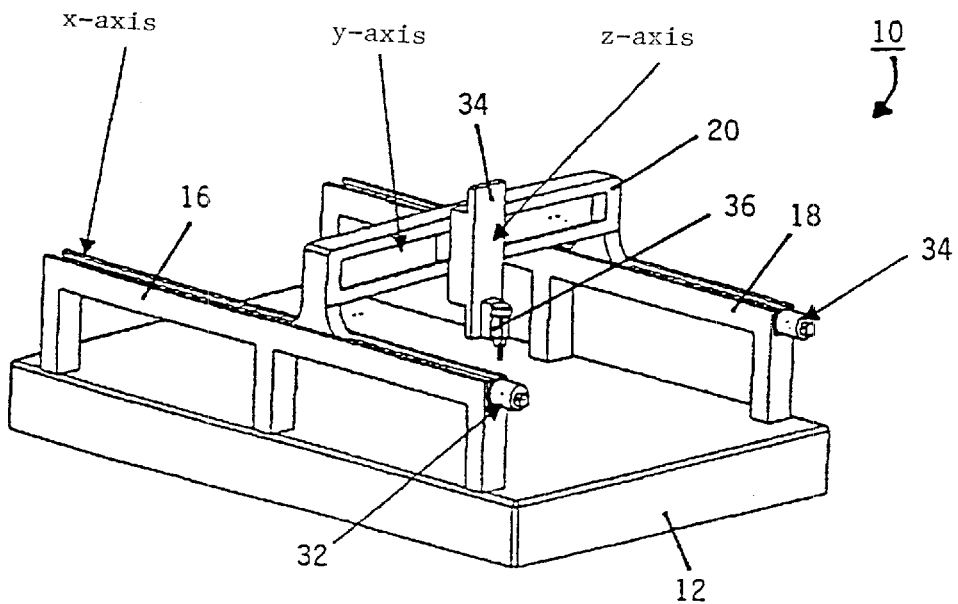
Figure 3:
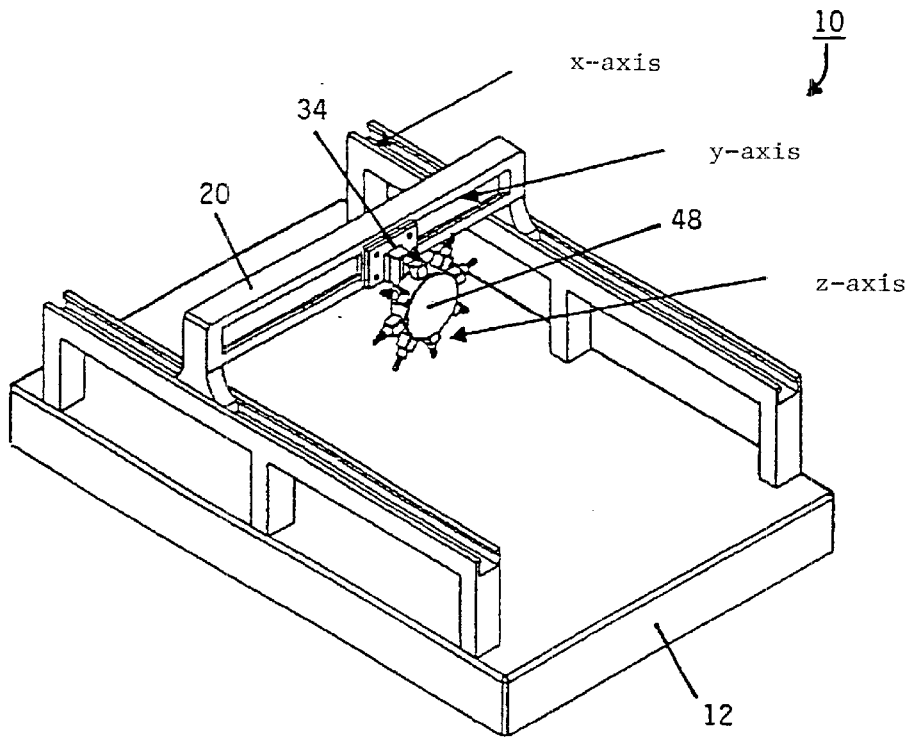
Figure 4:
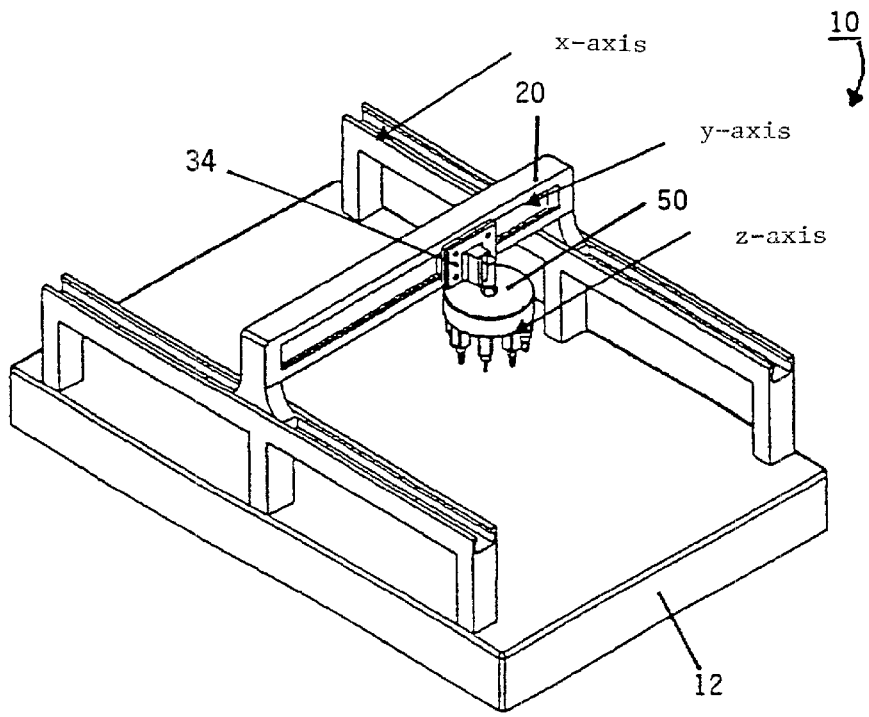
Figure 5:
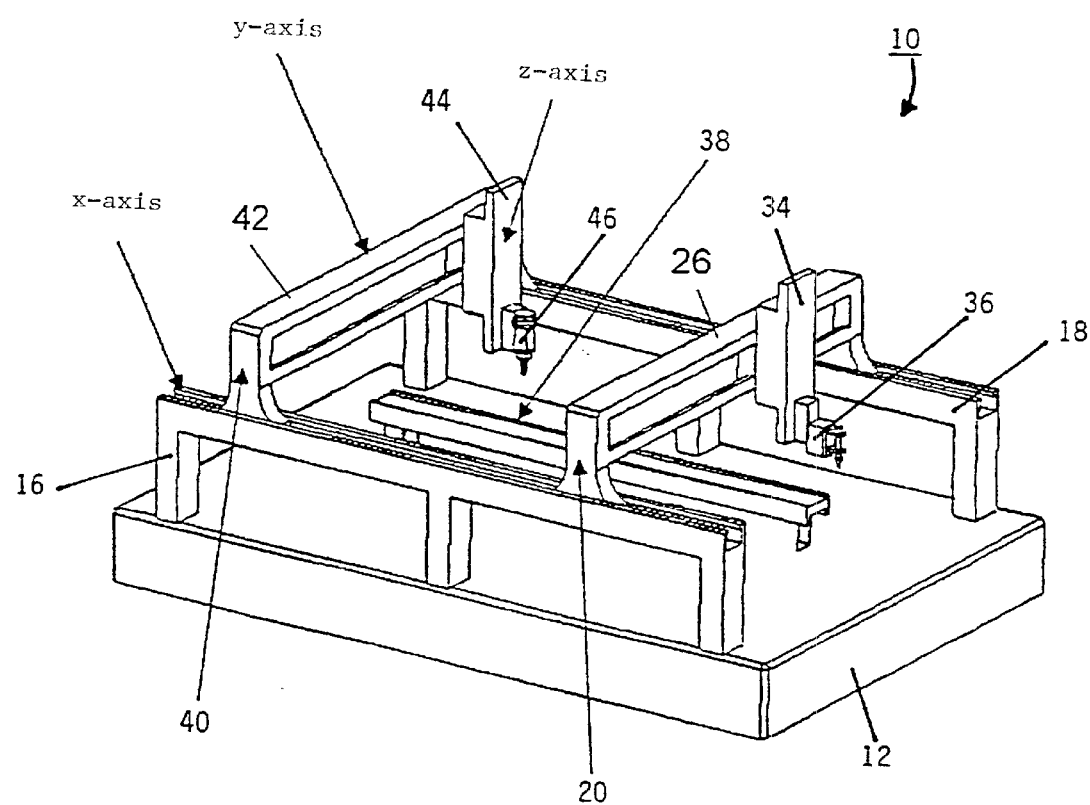
Figure 6:
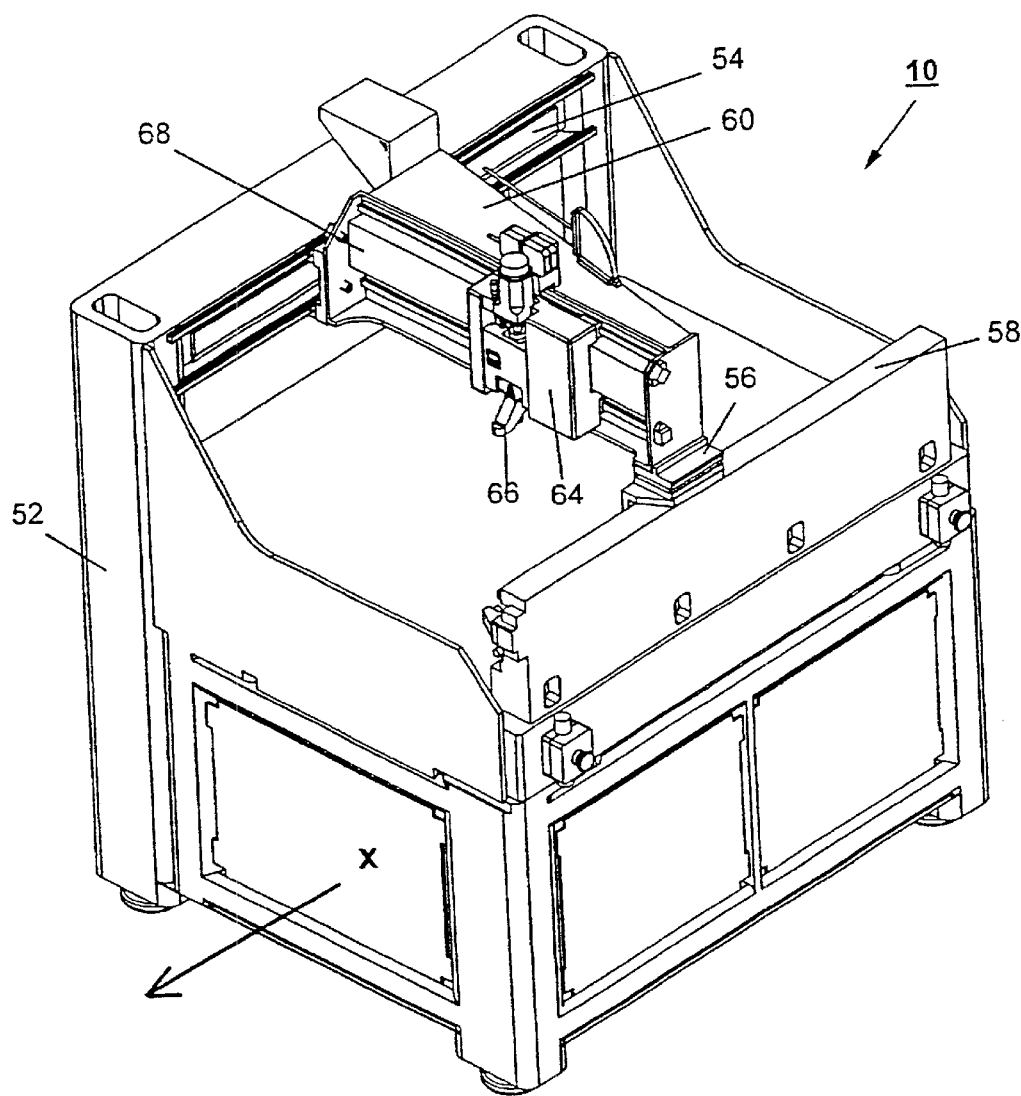
Figure 7:
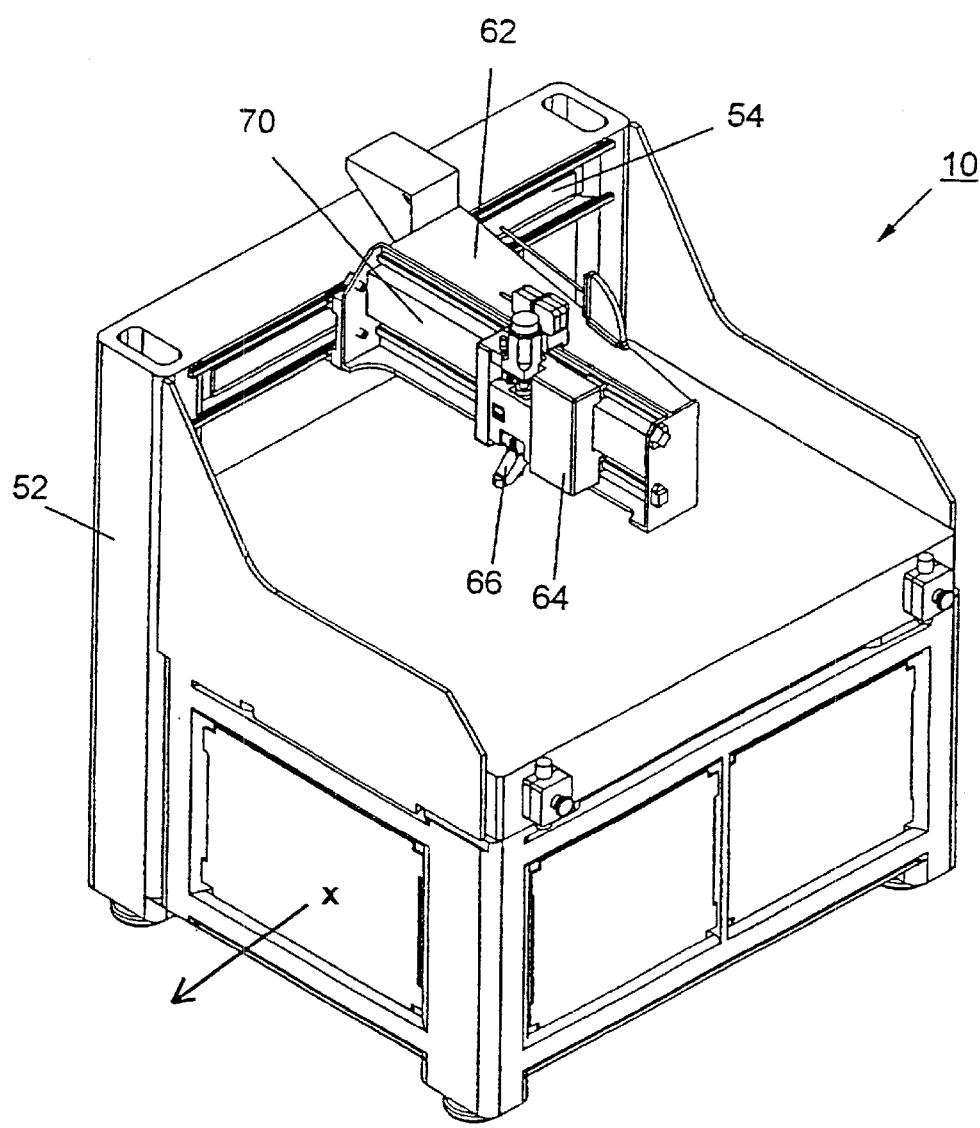

Further details, features and advantages of the invention result from the following description of several graphically represented embodiments. Therein shows:

FIG. 1 a schematically illustrated inventive assembly device comprising one portal;

FIG. 2 a schematically illustrated inventive assembly device pursuant to FIG. 1 comprising shown portals;

FIG. 3 a further embodiment of the inventive assembly device comprising a vertically arranged turret head;

FIG. 4 a further embodiment of the inventive assembly device comprising a horizontally arranged turret head;

FIG. 5 a further embodiment of the inventive assembly device comprising two portals;

FIG. 6 a further embodiment of the inventive assembly device comprising one portal; and FIG. 7 a further embodiment of the inventive assembly device comprising one portal.

FIG. 1 shows a first embodiment of the assembly device 10, in particular for the use as a fully automatic assembly device for producing microsystem technical products and for assembling components in the semiconductor industries. The assembly device 10 comprises an assembly table 12 having an assembly level or table level 14. On the table level 14, a transport system 16, 18 is arranged. The transport system 16, 18 is comprised of a rail system having two parallelly arranged rails 16, 18. Moreover, it can be recognized that the rails 16, 18 are arranged above the table level or assembly level 14 of the assembly table 12. Yet, it is also possible to arrange said transport system 16, 18 at the table level, i.e. on the assembly table, or to articulate the transport system 16, 18 directly to the basic machine frame so as to achieve an optimized transmission of forces to carrying machine parts.

By means of the transport system 16, 18, a portal 20 is moved. The portal 20 is comprised, in this case, of a first and a second portal support 22, 24, each of which are engaging in the rails 16, 18 and are being guided therein. The two portal supports 22, 24 are connected with each other by means of a portal carrier 26. The portal carrier 26 comprises in its longitudinal direction an oblong engagement opening 28 in which a component transport unit 34 gets into engagement and is movably guided. On the component transport unit 34, an assembly head 36 is movably and releasably attached.

One recognizes that the portal 20 is displaceable along the x-axis in parallel to the direction of the material transport. The material transport ensues in this case also in the direction of the x-axis and by means of a material transport system 38, which is likewise arranged in the area of the assembly level or table level 14.

It becomes evident that the orientation of the transport system 16, 18 and the direction of the material transport forms the x-axis, the portal carrier 26 of portal 20 orientated perpendicularly thereto forms the y-axis, and the direction of movement of the component transport unit 34 and of the assembly head 36, respectively, which direction is vertical to the y-axis, forms the z-axis of the spatial arrangement of the assembly device 10. Thereby, either the entire component transport unit 34 or only the assembly head 36 on the component transport unit 34 can be moved in the direction of the z-axis.

FIG. 2 shows an assembly device 10 pursuant to FIG. 1. One recognizes in addition, the arrangement of a first and a second portal drive 30, 32, each arranged in one rail 16 and 18, respectively, of the transport system.

The FIGS. 3 and 4 each show further embodiments of the assembly device 10. In this case, the assembly head is replaced by a vertically and horizontally, respectively, arranged turret head 48, 50. The vertical and horizontal, respectively, arrangement of the turret heads 48, 50, thereby means the vertical and horizontal, respectively, rotation of the turret heads 48, 50 with respect to the assembly level or table level 14. FIG. 5 shows a further embodiment of the assembly device 10 comprising two displaceable portals 20, 40 arranged one behind the other having corresponding portal carriers 26, 42. The movement of the portals 20, 40, in this case can be mutually synchronized. It is possible to provide for both portals 20, 40 separate portal drives each, or even one common portal drive. Moreover, it is possible that the portals 20, 40 exhibit various heights so that different assembly levels arise. The represented embodiment, however, shows an assembly device 10 having two identically configured portals 20, 40.

FIG. 6 shows a further embodiment of the assembly device 10 having one portal 60 and one transport system 54 for moving the portal 60 in parallel to the direction of the material transport, i.e. in parallel to the movement axis of the products to be placed with components (x-axis). The transport system 54 in this case is comprised of a third rail 54 arranged in a machine frame 52 of the assembly device 10 parallel to the direction of the transport (x-axis) of the products to be placed with components, which products are in turn displaced by means of the material transport system/s 38. The portal carrier 68 of portal 60 thereby comprises a further transport system for moving the component transport unit 64 including the assembly head 66, and engages perpendicularly (y-axis, cf. FIG. 5) in the rail 54. The portal 60 is displaceable in the direction of the x-axis. Since the portal 6b engages perpendicularly in the frame 52 via the rail 54, any movement forces from the movement along the y-axis of the component transport unit 64 and the assembly head 66 can be dissipated via the machine frame 52, thereby entailing favourable conditions with respect to occurring machine vibrations, in particular reduced vibrations due to the utilized rigidity of the machine frame 52. The portal 60 and the portal carrier 68, respectively, thereby comprises at its end lying opposite to the rail 54, a bearing 56, which comes to rest on a counter-bearing 58 formed in the machine frame 52 and arranged in parallel to the rail 54.

FIG. 7 shows a further embodiment of the assembly device 10 comprising one portal 62 and the transport system 54 for moving the portal 62 in parallel to the direction of the material transport (x-axis). One recognizes that a portal carrier 70 of the portal 62 provided with a transport system for the component transport unit 64 engages into the rail 54, so that the portal 60 is displaceable in the direction of the x-axis. In contrast to the embodiment of the assembly device 10 represented in FIG. 6, this embodiment renounces of a counter-bearing for the portal carrier 70.

What is claimed is:

1. Assembly device for a fully automatic assembly producing microsystem technical products and for assembling components in the semiconductor industries, comprising: an assembly table, at least one material transport system that transports the products to be placed with components, at least one transport system arranged on the assembly table, and at least one component transport unit that is arranged and displaceable perpendicularly to the transport system and that comprises at least one assembly head, wherein that the component transport unit is arranged on a portal displaceable by means of the transport system in parallel to the direction of transport of the products to be placed with components, which products are in turn displaced by the material transport system.

2. Assembly device according to claim 1, characterized in that the transport system is comprised of a first rail and a second rail arranged parallel to each other.

3. Assembly device according to claim 1, characterized in that the transport system is comprised of a rail arranged in a machine frame of the assembly device in parallel to the direction of transport of the products to be placed with components, which products are in turn displaced by the material transport system, at least one portal carrier engaging perpendicularly into said rail, so that the portal is displaceable.

4. Assembly device according to claim 3, characterized in that the portal and the portal carrier, respectively, comprises at its end lying opposite to the rail a bearing, said bearing coming to rest on a counter-bearing formed in the machine frame and being arranged parallel to the rail.

5. Assembly device according to claim 1, characterized in that the transport system comprises at least one portal drive.

6. Assembly device according to claim 1, wherein the transport system is arranged above the table level of the assembly table.

7. Assembly device according to claim 1, characterized in that the orientation of the transport system forms the x-axis, a portal carrier of the portal orientated perpendicularly thereto forms the y-axis, and a direction of movement of the component transport unit, and of the assembly head, respectively, which direction is vertical to the y-axis, forms the z-axis of the spatial arrangement of the assembly device.

8. Assembly device according to claim 1, characterized in that the movements of a plurality of portals can be mutually synchronized.

9. Assembly device according to claim 1, characterized in that the assembly head is comprised of a vertically or horizontally arranged turret head.

* * * * *

UNITED STATES PATENT AND TRADEMARK OFFICE
CERTIFICATE OF CORRECTION

PATENT NO. : 6,574,857 B1
DATED : June 10, 2003
INVENTOR(S) : Joachim Pajonk, et al.

It is certified that error appears in the above-identified patent and that said Letters Patent is hereby corrected as shown below:

Column 5,
Line 4, "6b" should read -- 60 --; and
Line 34, "wherein that" should read -- wherein --.

Signed and Sealed this

Thirty-first Day of August, 2004

JON W. DUDAS
*Director of the United States Patent and Trademark Office*